US008415546B2

(12) United States Patent
Kim et al.

(10) Patent No.: US 8,415,546 B2
(45) Date of Patent: Apr. 9, 2013

(54) SINGLE CRYSTALLINE METAL NANOPLATE AND THE FABRICATION METHOD THEREOF

(75) Inventors: Bongsoo Kim, Daejeon (KR); Youngdong Yoo, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 12/671,611

(22) PCT Filed: Sep. 22, 2009

(86) PCT No.: PCT/KR2009/005388
§ 371 (c)(1),
(2), (4) Date: Feb. 1, 2010

(87) PCT Pub. No.: WO2010/033005
PCT Pub. Date: Mar. 25, 2010

(65) Prior Publication Data
US 2011/0262702 A1    Oct. 27, 2011

(30) Foreign Application Priority Data
Sep. 22, 2008   (KR) .................. 10-2008-0092652

(51) Int. Cl.
*C30B 29/64*   (2006.01)
(52) U.S. Cl. .............. 977/775; 117/84; 117/87; 117/88; 117/99; 117/101; 117/102; 117/106; 117/200; 117/204; 117/205; 977/755; 977/773; 977/810; 977/890; 977/891; 977/900
(58) Field of Classification Search .............. 117/84, 117/87–88, 99, 101–102, 106, 200, 204–205, 117/938; 977/755, 773, 775, 777, 810, 890–891, 977/900
See application file for complete search history.

(56) References Cited

U.S. PATENT DOCUMENTS

| 6,858,521 | B2 * | 2/2005 | Jin .................................. 438/551 |
| 7,303,815 | B2 * | 12/2007 | Yang et al. ..................... 428/357 |
| 2010/0090345 | A1 * | 4/2010 | Sun ................................ 257/769 |

FOREIGN PATENT DOCUMENTS

KR    2006-0009735    2/2006

OTHER PUBLICATIONS

Michely, et al. publication entitled "Inversion of growth speed anisotropy in two dimensions," Physical Review Letters, vol. 70, pp. 3943-3946 (1993).*

* cited by examiner

*Primary Examiner* — Robert M Kunemund
*Assistant Examiner* — Kenneth A Bratland, Jr.
(74) *Attorney, Agent, or Firm* — Cantor Colburn LLP

(57) ABSTRACT

Disclosed is a fabrication method of a metal nanoplate using metal, metal halide or a mixture thereof as a precursor. The single crystalline metal nanoplate is fabricated on a single crystalline substrate by performing heat treatment on a precursor including metal, metal halide or a mixture thereof and placed at a front portion of a reactor and the single crystalline substrate placed at a rear portion of the reactor under an inert gas flowing condition. A noble metal nanoplate of several micrometers in size can be fabricated using a vapor-phase transport process without any catalyst. The fabricated nanoplate is a single crystalline metal nanoplate having high crystallinity, high purity and not having a two-dimensional defect. Morphology and orientation of the metal nanoplate with respect to the substrate can be controlled by controlling a surface direction of the single crystalline substrate. The metal nanoplate of several micrometer size is mass-producible.

7 Claims, 20 Drawing Sheets

SINGLE CRYSTALLINE METAL NANOPLATE AND THE FABRICATION METHOD THEREOF

TECHNICAL FIELD

The present invention relates to a fabrication method of a metal nanoplate using metal material as a precursor by a vapor-phase transport process without any catalyst and a metal nanoplate fabricated by the same.

BACKGROUND ART

Noble metal has chemical stability, biocompatibility, electric and thermal conductivity, surface plasmon property, and is widely used in catalysts, chemical/bio sensors, photoelectric devices, nano devices, surface enhanced Raman scattering (SERS) and so on.

Optical properties of the noble metal are largely influenced by the morphology thereof, and can be applied, when it is made to a single crystalline nanoplate, as plasmonics, bio sensors, molecular electronic devices and so on.

In general, a metal nanostructure can absorb molecules on a surface thereof using self-assembled monolayer (SAM), and it is possible to obtain a molecular layer uniformly absorbed on a surface of a noble metal nanostructure using this phenomenon.

Studies for developing biomolecule analysis technologies and optical devices can be performed by observing the SERS phenomenon of molecules using the noble metal nanoplate and the SAM and applying molecules that form the SAM as a linker, and particularly, utilization of uniformly produced noble metal nanoplate structure in the SERS detection can be used as a very sensitive analysis technology.

Existing studies for the optical device development using the plasmonics have been mostly performed by using metal nanoparticles. However, when using the metal nanoparticles, it is difficult to obtain the plasmonic structure and optical device having the desired stability since it is impossible to accurately control the structure of the metal nanoparticles.

However, the noble metal nanoplate which has no internal crystal defect and is made of high purity and high quality single crystal is a single crystalline metal nanoplate which has no defect and defined well at an atomic level. Therefore, this weakness can be solved by coupling synthesized the single crystalline noble metal nanoplate with the plasmonics.

Fabrication of the plasmonic structure by controlling a complete single crystalline metal nanoplate and control of molecular arrangement and Raman signal by applying external electric fields are expected to be a great turning point that will give major growth of a study for developing hybrid optical devices.

The metal nanostructure has been numerously studied and developed in earnest after 1990s and most of the studied and developed nanostructures were related to the form of a nanoparticle or a nanoplate. Studies for fabrication and application of a two-dimensional nanostructure such as a nanoplate were insignificant, and particularly, there has been no report on the fabrication of a metal (metal including noble metals) nanoplate, which has a size of several micrometer and made of a high purity and high quality single crystalline body, using a vapor-phase transport process.

Korean patent application publication No. 2006-0009735 discloses a fabrication method of a gold nanoplate using a liquid-phase process, but the method has a limitation in that it is difficult to control the morphology and size of the noble metal nanoplate, the fabricated noble metal nanoplate has low purity and a polycrystalline nanoplate having defects within the nanoplate is synthesized.

Therefore, the present applicants will provide a fabrication method of a high purity single crystalline metal nanoplate with no 2-dimensional defect including twin on a single crystalline substrate by a vapor-phase transport process using metal, metal halide or a mixture thereof as a precursor, a fabrication method of a metal nanoplate epitaxially with a single crystalline substrate, and an easily mass-producible method in which a side of a metal nanoplate has a length of several micrometers, a large amount of the nanoplates is arranged in parallel relation to each other and an orientation with respect to a substrate and a morphology can be controlled.

DISCLOSURE

Technical Problem

An object of the present invention is to provide a fabrication method of a high purity single crystalline metal nanoplate with no two-dimensional defect including twin without any catalyst, providing a fabrication method of a single crystalline metal nanoplate in which a side of the nanoplate has a length of several micrometers and the morphology of the nanoplate is uniform, providing a fabrication method of a metal nanoplate in which the nanoplate is not produced irregularly, but planes of the plate is parallel to each other and have a predetermined orientation with respect to a single crystalline substrate, and providing a fabrication method of a single crystalline metal nanoplate in which an orientation and a morphology of the nanoplate are controllable.

Technical Solution

To achieve the object of the present invention, the present invention provides a fabrication method of a single crystalline metal nanoplate, wherein the single crystalline metal nanoplate is fabricated on a single crystalline substrate by performing heat treatment on a precursor including metal, metal halide or a mixture thereof and placed at a front portion of a reactor and the single crystalline substrate placed at a rear portion of the reactor under an inert gas flowing condition. At this time, the metal material used as the precursor includes slug or powder form.

The single crystalline metal nanoplate fabricated on the single crystalline substrate has a polygonal plate shape, and the polygonal plate is of hexagonal, pentagonal, rectangular, triangular, paralelogrammic or trapezoidal shape.

A morphology of the single crystalline metal nanoplate, an orientation of the single crystalline metal nanoplate with respect to a surface of the single crystalline substrate, or a combination thereof is controlled by controlling a material and a surface direction of the single crystalline substrate on which the single crystalline metal nanoplate is fabricated.

At this time, the orientation means that a predetermined angle is formed between a unit vector (I) which is vertical to the surface of the single crystalline substrate and a unit vector (II) which is vertical to a plate plane of the single crystalline nanoplate, and the predetermined angle is one or more angle having a value between 0 and 90°.

The single crystalline substrate may be a sapphire of a({11-20}) surface, a sapphire of r({1-102}) surface, a sapphire of m({1-100}) surface, a sapphire of c({0001}) surface, lanthanum aluminum oxide (LAO) of {001} surface, strontium titanate (STO) of {100} surface, or titanium dioxide of {110} surface.

The single crystalline metal nanoplate is epitaxially grown on the single crystalline substrate, so that the single crystalline metal nanoplate and the single crystalline substrate have an epitaxial relation.

The precursor is a noble metal material, so that a single crystalline noble metal nanoplate is fabricated on the single crystalline substrate.

Specifically, the noble metal material is a material selected from the group consisting of Pt, Au, Ag and Pd, and the single crystalline noble metal nanoplate may be a single crystalline Pt nanoplate, a single crystalline Au nanoplate, a single crystalline Ag nanoplate, a single crystalline Pd nanoplate, or a single crystalline binary alloy nanoplate made of two noble metals selected from the group consisting of Pt, Au, Ag and Pd. The binary alloy includes a solid-solution phase or an intermetallic compound phase.

In order to fabricate the single crystalline noble metal nanoplate (including single crystalline binary alloy nanoplate), the precursor is the noble metal material itself of the single crystalline noble metal nanoplate to be fabricated.

Preferably, the precursor is Au, and the precursor is maintained at 1,200 to 1,300° C. and the single crystalline substrate is maintained at 850 to 1,050° C., so that an Au nanoplate is fabricated on the single crystalline substrate.

At this time, the inert gas flows at 50 to 150 sccm from the front portion of the reactor to the rear portion of the reactor and the heat treatment is performed at a pressure of 5 to 20 torr.

Preferably, the precursor is Pd, and the precursor is maintained at 1,200 to 1,300° C. and the single crystalline substrate is maintained at 850 to 1,050° C., so that a Pd nanoplate is fabricated on the single crystalline substrate.

At this time, the inert gas flows at 50 to 150 sccm from the front portion of the reactor to the rear portion of the reactor and the heat treatment is performed at a pressure of 5 to 20 torr.

Preferably, the precursor is a mixture of Au and Pd, and the precursor is maintained at 1,200 to 1,300° C. and the single crystalline substrate is maintained at 850 to 1,050° C., so that an AuPd binary alloy nanoplate is fabricated on the single crystalline substrate.

At this time, the inert gas flows at 50 to 150 sccm from the front portion of the reactor to the rear portion of the reactor and the heat treatment is performed at a pressure of 5 to 20 torr.

Preferably, the precursor is Ag, and the precursor is maintained at 800 to 850° C. and the single crystalline substrate is maintained at 550 to 700° C., so that an Ag nanoplate is fabricated on the single crystalline substrate.

At this time, the inert gas flows at 50 to 150 sccm from the front portion of the reactor to the rear portion of the reactor and the heat treatment is performed at a pressure of 5 to 20 torr.

Preferably, the precursor is Pt halide, and the precursor is maintained at 450 to 500° C. and the single crystalline substrate is maintained at 1,000 to 1,050° C., so that a Pt nanoplate is fabricated on the single crystalline substrate.

At this time, the inert gas flows at 200 to 400 sccm from the front portion of the reactor to the rear portion of the reactor and the heat treatment is performed at a pressure of 750 to 770 torr.

The precursor is a mixture of a transition metal material and a transition metal halide, so that a transition metal nanoplate or a binary alloy nanoplate made of two transition metals is fabricated on the single crystalline substrate. The binary alloy includes a solid-solution phase or an intermetallic compound phase.

The halide of the transition metal is bromide, iodide, chloride or fluoride of the transition metal.

The transition metal material or a transition metal of the transition metal halide is one selected from the group consisting of Ti, V, Cr, Mn, Fe, Co, Ni, Zn, Y, Zr, Nb, Cd, Ta and W, and the transition metal nanoplate is a Ti, V, Cr, Mn, Fe, Co, Ni, Zn, Y, Zr, Nb, Cd, Ta or W nanoplate. Further, the binary alloy nanoplate made of two transition metals includes two selected from the group consisting of Ti, V, Cr, Mn, Fe, Co, Ni, Zn, Y, Zr, Nb, Cd, Ta and W.

The precursor for the fabrication of the transition metal nanoplate includes all of the transition metal itself of the transition metal to be fabricated and the halide of the transition metal to be fabricated. The precursor for the fabrication of the binary alloy nanoplate made of two transition metals includes the transition metal itself of one transition metal constituting the binary alloy nanoplate to be fabricated and the halide of one transition metal constituting the binary alloy nanoplate to be fabricated.

Preferably, the precursor is a mixture of Ni and Ni halide, and the precursor is maintained at 700 to 900° C. and the single crystalline substrate is maintained at 800 to 1,000° C., so that a Ni nanoplate is fabricated on the single crystalline substrate.

At this time, the inert gas flows at 50 to 200 sccm from the front portion of the reactor to the rear portion of the reactor and the heat treatment is performed at a pressure of 750 to 770 torr.

Preferably, the precursor is a mixture of Ni, Ni halide and Co halide, and the precursor is maintained at 700 to 900° C. and the single crystalline substrate is maintained at 800 to 1,000° C., so that a Ni—Co binary alloy nanoplate is fabricated on the single crystalline substrate.

At this time, the inert gas flows at 50 to 200 sccm from the front portion of the reactor to the rear portion of the reactor and the heat treatment is performed at a pressure of 750 to 770 torr.

Further, the present invention provides a single crystalline metal nanoplate, which is a single crystal body of a polygonal plate shape fabricated on a single crystalline substrate by performing heat treatment on a precursor including metal, metal halide or a mixture thereof and placed at a front portion of a reactor and the single crystalline substrate placed at a rear portion of the reactor under an inert gas flowing condition.

Specifically, the metal nanoplate may be a noble metal nanoplate, a binary alloy nanoplate (I) made of two noble metals, a transition metal nanoplate, and a binary alloy nanoplate (II) made of two transition metals The single crystalline nanoplate of the polygonal plate shape may be a hexagonal, pentagonal, rectangular, triangular, paralelogrammic or trapezoidal nanoplate, the single crystalline metal nanoplate has an epitaxial relation with respect to the single crystalline substrate on which the single crystalline metal nanoplate is formed, and at least two single crystalline metal nanoplates are parallel to each other.

The single crystalline metal nanoplate has a face centered cubic (FCC) structure, and a plate plane of the single crystalline metal nanoplate is {111} plane and a direction of a side of the nanoplate includes <110> direction.

Advantageous Effects

In accordance with the present invention, a noble metal nanoplate, a noble metal binary alloy nanoplate, a transition metal nanoplate or a transition metal binary alloy nanoplate can be fabricated using a vapor-phase transport process without any catalyst, a metal nanoplate with a size of several to tens micrometers can be fabricated, the process is simple and reproducible, and the fabricated nanoplate is a single crystalline metal nanoplate having high crystallinity and high purity and not having a two-dimensional defect and impurities.

Also, in accordance with the present invention, a size of the metal nanoplate can be controlled simply by controlling a heat treatment time, a morphology of the metal nanoplate and an orientation of the metal nanoplate with respect to the substrate can be controlled, and the metal nanoplate having a side length of several micrometers is mass-producible.

DESCRIPTION OF DRAWINGS

The above and other objects, features and advantages of the present invention will become apparent from the following description of preferred embodiments given in conjunction with the accompanying drawings, in which.

BEST MODE

Figure 1:
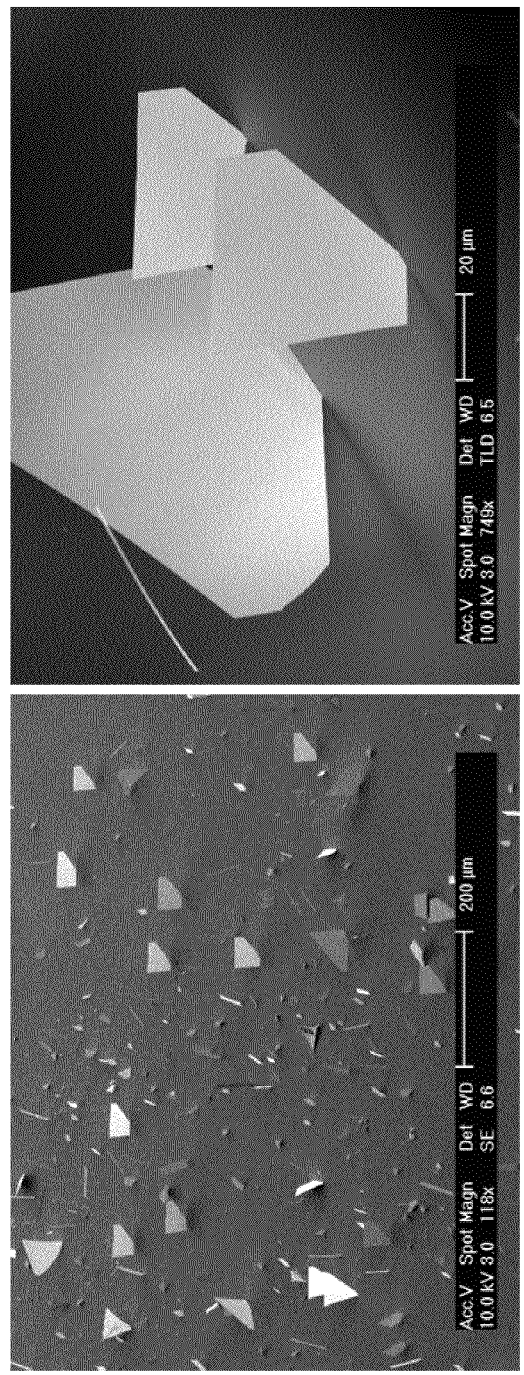
FIG. 1 is a photograph by a scanning electron microscope (SEM) of an Au nanoplate fabricated through Example 1.

Hereinafter, the embodiments of the present invention will be described in detail with reference to accompanying drawings. Unless defined otherwise, all technical and scientific terms used herein have the same meanings as commonly understood by one of ordinary skill in the art to which the present invention belongs. And well-known functions and constructions which may unnecessarily obscure the subject matter of the present invention will not be described in detail.

The present invention provides a fabrication method of a single crystalline metal nanoplate, wherein the single crystalline metal nanoplate is fabricated on a single crystalline substrate by performing heat treatment on a precursor including metal, metal halide or a mixture thereof and placed at a front portion of a reactor and the single crystalline substrate placed at a rear portion of the reactor under an inert gas flowing condition. At this time, the inert gas preferably flows from the front portion of the reactor to the rear portion of the reactor since it functions to transport the vaporized precursor to the substrate.

The fabrication method of the present invention, since it fabricates a metal nanoplate on a single crystalline substrate by simply using metal material, metal halide or a mixture thereof as a precursor and fabricates single crystalline metal nanoplate through a vapor-phase material transport path without any catalyst, has advantages that the process is simple and reproducible and a high purity metal nanoplate with no impurity can be fabricated.

Also, since this method controls the temperatures of the front portion and rear portion of the reactor, controls a flow rate of the inert gas and a pressure in a heat treatment tube used in the heat treatment, and thus finally controls nucleation driving force, growth driving force, nucleation speed and growth speed of the metal material on the substrate, a size of the single crystalline metal nanoplate and a density thereof on the substrate are controllable and reproducible and it is possible to fabricate high quality single crystalline metal nanoplate having no defect and good crystallinity.

Specifically, the fabrication method of the present invention controls the temperature of the front portion of the reactor and the pressure in the tube so as to control a vaporization degree of the precursor, controls the flow rate of the inert gas so as to control a degree of transportation of the vaporized precursor onto the single crystalline substrate, and controls the temperature of the single crystalline sapphire substrate and the pressure in the tube so as to control a growth mechanism of the metal nanoplate fabricated on a sapphire substrate and the nucleation driving force/growth driving force on the substrate.

Preferably, the fabrication method controls the temperature of the single crystalline substrate and the pressure in the tube so as to fabricate a noble metal nanoplate on the single crystalline sapphire substrate with a mechanism of two-dimensional nucleation and lateral growth.

The subject matter of the present invention is to fabricate the metal nanoplate made of a single crystal body by vapor-phase transporting the precursor without using a catalyst. Essential conditions for fabricating the nanoplate of a high quality, a high purity and a preferred morphology are temperatures in the front portion and rear portion of the reactor, a flow rate of the inert gas and a pressure upon the heat treatment. And, the kind of the substrate and a surface direction of the substrate are controlled to control an orientation of the same metal nanoplate.

Specifically, the temperatures of the front portion and rear portion of the reactor are determined in consideration of physical properties such as a melting point, vaporizing point and vaporizing energy of the precursor, the flow rate of the inert gas, the pressure upon the heat treatment, and a temperature at which a cusp of the surface energy is shown according to the surface direction by the kinds of the metal material of the nanoplate.

The precursor may be Au, Pd or a mixture of Au and Pd, and the precursor (the front portion of the reactor) is maintained at 1,200 to 1,300° C. The precursor may be Ag, and the precursor (the front portion of the reactor) is maintained at 450 to 500° C. Also, the precursor may be a mixture of Ni and Ni halide, or a mixture of Ni halide and Co halide, and the precursor (the front portion of the reactor) is maintained at 700 to 900° C.

The temperature of the single crystalline substrate is preferably controlled so that a cusp is present in the surface energy according to the surface direction of the noble metal material of the single crystalline metal nanoplate to be fabricated and thus different growth speeds are shown according to the surface directions, and is preferably controlled so that there is a large difference of the driving force required in the two-dimensional nucleation and growth between the surface directions and thus the morphology of the nanoplate can be formed.

The temperature of the single crystalline substrate (the rear portion of the reactor) is controlled and the driving forces of the nucleation and growth of the metal nanoplate on the single crystalline substrate by the vaporized precursor are controlled, so that the single crystalline nanoplate is a nanoplate of a polygonal plate shape.

The precursor may be Au, Pd or a mixture of Au and Pd, and the single crystalline substrate (the rear portion of the reactor) is maintained at 850 to 1,050° C. The precursor may be Ag, and the single crystalline substrate (the rear portion of the reactor) is maintained at 550 to 700° C. Also, the precursor may be a mixture of Ni and Ni halide, or a mixture of Ni halide and Co halide, and the single crystalline substrate (the rear portion of the reactor) is maintained at 800 to 1,000° C.

The flow rate of the inert gas and the pressure upon the heat treatment mainly have an influence on an amount of the precursor provided to the single crystalline substrate and a mechanism of supplying the precursor to the nucleus on the substrate, and the flow rate of the inert gas and the pressure upon the heat treatment are controlled together with the aforementioned temperatures of the single crystalline substrate and the precursor to fabricate a metal nanoplate of several to tens micrometer order single crystal body.

The precursor may be Au, Pd, Ag or a mixture of Au and Pd, and the inert gas flows at 50 to 150 sccm from the front portion of the reactor (the precursor) to the rear portion of the reactor (the single crystalline substrate). The precursor may be Pt halide, and the inert gas flows at 200 to 400 sccm from the front portion of the reactor (the precursor) to the rear portion of the reactor (the single crystalline substrate). Also, the precursor may be a mixture of Ni and Ni halide, or a mixture of Ni halide and Co halide, and the inert gas flows at 50 to 200 sccm from the front portion of the reactor (the precursor) to the rear portion of the reactor (the single crystalline substrate).

The precursor may be Au, Pd, Ag or a mixture of Au and Pd, and the heat treatment for the fabrication of the single crystalline metal nanoplate is performed at a pressure of 5 to 20 torr. Also, the precursor may be a Pt halide, a mixture of Ni and Ni halide, or a mixture of Ni halide and Co halide, and the heat treatment for the fabrication of the single crystalline metal nanoplate is performed at a pressure of 750 to 770 torr.

The aforementioned temperature of the single crystalline substrate, temperature of the precursor, flow rate of the inert gas and pressure upon the heat treatment have an influence on the vaporization degree of the precursor, the amount of the vaporized precursor transported to the single crystalline substrate per hour, the nucleation and growth speed of the metal material on the single crystalline substrate, a surface energy of the metal material (nanoplate) produced on the single crystalline substrate, a coagulation degree of the metal material (nanoplate) produced on the single crystalline substrate, and a morphology of the metal material (nanoplate) produced on the single crystalline substrate.

The heat treatment time should also be controlled according to the aforementioned temperatures, flow rate of the inert gas, pressure on the heat treatment and the final size of the noble metal nanoplate to be fabricated, and preferably the heat treatment is performed for 1 to 2 hours so as to fabricate the noble metal nanoplate having a side length of several micrometers under the aforementioned conditions.

During the aforementioned heat treatment time, the vaporized precursor is transported onto the single crystalline substrate by the inert gas to anticipate the nucleation and growth. At the same time, mass transfer of the metal through the vapor-phase and substrate surface is generated between the metal materials (metal nanoplate or nucleuses of the metal nanoplate) preciously formed on the single crystalline substrate to generate growth and extinction of the metal nanoplate.

Therefore, the single crystalline substrate formed with the metal nanoplate is heat treated again with the precursor being removed after the aforementioned heat treatment, so that a density and a size of the metal nanoplate are adjusted again. The morphology of the single crystalline metal nanoplate, an orientation of the single crystalline metal nanoplate with respect to the surface of the single crystalline substrate, or the combination thereof is controlled by controlling the material and surface direction of the single crystalline substrate on which the single crystalline metal nanoplate is fabricated.

Specifically, a single crystalline metal nanoplate having a random orientation or an orientation with respect to the surface of the substrate by using single crystal body of a material, which does not chemically react with the precursor upon the aforementioned heat treatment or the fabricated single crystalline metal nanoplate and is thermally and chemically stable, on the basis of the unique crystalline structure of the metal material of the single crystalline metal nanoplate to be fabricated.

When to fabricate the single crystalline metal nanoplate having a random orientation, any single crystal body can be used as the substrate provided that it does not chemically react with the precursor upon the aforementioned heat treatment or the fabricated single crystalline metal nanoplate and is thermally and chemically stable. An example may include a non-conductor or semiconductor single crystalline substrate.

When to fabricate the single crystalline metal nanoplate having an orientation, the material and surface (crystal plane) of the single crystalline substrate is a surface of a nonconductor or semiconductor single crystal body on which a nucleation, particularly a two-dimensional nucleation is easily generated, and is also a surface of a nonconductor or semiconductor single crystal body in which an elastic stress or defect induced by a lattice mismatch is not easily generated. In one example, the single crystalline substrate is a sapphire of a($\{11\text{-}20\}$) surface, a sapphire of r($\{1\text{-}102\}$) surface, a sapphire of m($\{1\text{-}100\}$) surface, a sapphire of c($\{0001\}$) surface, lanthanum aluminum oxide (LAO) of $\{001\}$ surface, strontium titanate (STO) of $\{100\}$ surface, or titanium dioxide of $\{110\}$ surface.

In the fabrication method in accordance with the present invention, the metal nanoplate to be fabricated is formed by epitaxial growth on the single crystalline substrate.

By this epitaxial relation between the single crystalline substrate and the single crystalline metal nanoplate, a plurality of the single crystalline metal nanoplates fabricated on the single crystalline substrate have a relation parallel to each other and the single crystalline metal nanoplate has a specific orientation with respect to the single crystalline substrate.

Also, by the epitaxial relation between the single crystalline substrate and the single crystalline metal nanoplate, a crystal plane of the single crystalline metal nanoplate that is epitaxial with respect to the single crystalline substrate varies with the surface direction of the single crystalline sapphire substrate and the final morphology of the nanoplate thus varies.

Therefore, the morphology of the single crystalline metal nanoplate, the orientation of the single crystalline metal nanoplate with respect to a surface of the single crystalline substrate, or the combination thereof is controlled by controlling the material and surface direction of the single crystalline substrate on which the single crystalline metal nanoplate is fabricated.

EXAMPLE 1

Fabrication of Single Crystalline Au Nanoplate

A reactor is divided into a front portion and a rear portion which are provided with a heating element and a temperature controller, respectively. A tube in an inside of the reactor was made of quartz and had a size of 1 inch in diameter and 60 cm in length.

A boat type crucible of a high purity alumina material containing 3.9 g of Au slug (Sigma-Aldrich, 373176-3.9G) therein was placed in the middle of the front portion of the reactor and a single crystalline LAO substrate (MTI corporation, LAOa050505S1) having a (001) surface was placed in the middle of the rear portion of the reactor.

Argon gas is inputted into the front portion of the reactor and is discharged from the rear portion of the reactor, and the rear portion of the reactor is provided with a vacuum pump. The pressure in an inside of the quartz tube was maintained at 15 torr using the vacuum pump and Ar was controlled to flow at 100 sccm using a Mass Flow Controller (MFC).

Heat treatment was performed for 2 hours with the temperature of the front portion of the reactor (alumina crucible containing precursor therein) being maintained at 1,250° C. and the rear portion of the reactor (single crystalline sapphire substrate) being maintained at 1,000° C. to fabricate an single crystalline Au nanoplate.

EXAMPLE 2

Fabrication of Single Crystalline Au Nanoplate

Fabrication of a single crystalline Au nanoplate was performed using the same apparatus and condition as those of Example 1, except that a single crystalline sapphire substrate of m-plane was used as the single crystalline substrate.

EXAMPLE 3

Fabrication of Single Crystalline Ag Nanoplate

Fabrication of a single crystalline Ag nanoplate was performed using the same apparatus and condition as those of Example 1, except that 4.1 g of Ag lump (Sigma-Aldrich, 173249) was used as the precursor, a single crystalline sapphire substrate of a-plane was used as the single crystalline substrate, the temperature of the front portion of the reactor was 820° C., the temperature of the rear portion of the reactor was 630° C., the pressure in the tube was 5 torr, and the flow rate of the Ar was 100 sccm.

EXAMPLE 4

Fabrication of Single Crystalline Ag Nanoplate

Fabrication of a single crystalline Ag nanoplate was performed using the same apparatus and condition as those of Example 3, except that a single crystalline sapphire substrate of r-plane was used as the single crystalline substrate.

EXAMPLE 5

Fabrication of Single Crystalline Ag Nanoplate

Fabrication of a single crystalline Ag nanoplate was performed using the same apparatus and condition as those of Example 3, except that a single crystalline sapphire substrate of m-plane was used as the single crystalline substrate.

EXAMPLE 6

Fabrication of Single Crystalline Ag Nanoplate

Fabrication of a single crystalline Ag nanoplate was performed using the same apparatus and condition as those of Example 3, except that a (100) single crystalline STO substrate was used as the single crystalline substrate.

EXAMPLE 7

Fabrication of Single Crystalline Pd Nanoplate

Fabrication of a single crystalline Pd nanoplate was performed using the same apparatus and condition as those of Example 1, except that 0.5 g of Pd powder (Sigma-Aldrich, 203939-5g) was used as the precursor, a single crystalline sapphire substrate of a-plane was used as the single crystalline substrate, the temperature of the front portion of the reactor was 1,250° C., the temperature of the rear portion of the reactor was 1,000° C., the pressure in the tube was 5 torr, the flow rate of the Ar was 100 sccm, and the heat treatment time was 2 hours.

EXAMPLE 8

Fabrication of Single Crystalline Pd Nanoplate

Fabrication of a single crystalline Pd nanoplate was performed using the same apparatus and condition as those of Example 8, except that a (110) single crystalline $TiO_2$ substrate was used as the single crystalline substrate.

EXAMPLE 9

Fabrication of Single Crystalline AuPd Nanoplate

Fabrication of a single crystalline AuPd nanoplate was performed using the same apparatus and condition as those of Example 1, except that 0.5 g of Pd powder was used as the precursor, a single crystalline sapphire substrate of a-plane was used as the single crystalline substrate, the temperature of the front portion of the reactor was 1,250° C., the temperature of the rear portion of the reactor was 1,000° C., the pressure in the tube was 5 torr, the flow rate of the Ar was 100 sccm, and the heat treatment time was 2 hours.

EXAMPLE 10

Fabrication of Single Crystalline AuPd Nanoplate

Fabrication of a single crystalline AuPd nanoplate was performed using the same apparatus and condition as those of Example 9, except that a (110) single crystalline $TiO_2$ substrate was used as the single crystalline substrate.

EXAMPLE 11

Fabrication of Single Crystalline Pt Nanoplate

Fabrication of a single crystalline Pt nanoplate was performed using the same apparatus and condition as those of Example 1, except that 0.5 g of $PtCl_2$ (Sigma-Aldrich, 482315-1G) was used as the precursor, a single crystalline sapphire substrate of c-plane was used as the single crystalline substrate, the temperature of the front portion of the reactor was 475° C., the temperature of the rear portion of the reactor was 1,025° C., the pressure in the tube was 760 torr, the flow rate of the Ar was 300 sccm, and the heat treatment time was 2 hours.

EXAMPLE 12

Fabrication of Single Crystalline Pt Nanoplate

Fabrication of a single crystalline Pt nanoplate was performed using the same apparatus and condition as those of Example 12, except that a single crystalline sapphire substrate of m-plane was used as the single crystalline substrate.

EXAMPLE 13

Fabrication of Single Crystalline Pt Nanoplate

Fabrication of a single crystalline Pt nanoplate was performed using the same apparatus and condition as those of Example 12, except that a single crystalline sapphire substrate of r-plane was used as the single crystalline substrate.

EXAMPLE 14

Fabrication of Single Crystalline Pt Nanoplate

Fabrication of a single crystalline Pt nanoplate was performed using the same apparatus and condition as those of Example 12, except that a single crystalline sapphire substrate of a-plane was used as the single crystalline substrate.

EXAMPLE 15

Fabrication of Single Crystalline Ni Nanoplate

Fabrication of a single crystalline Ni nanoplate was performed using the same apparatus and condition as those of Example 1, except that 0.5 g of Ni (Sigma-Aldrich, 266965-50G) and 0.5 g of $NiCl_2$ (Sigma-Aldrich, 451195-5G) were used as the precursor, a single crystalline sapphire substrate of a-plane was used as the single crystalline substrate, the temperature of the front portion of the reactor was 800° C., the temperature of the rear portion of the reactor was 900° C., the pressure in the tube was 760 torr, the flow rate of the Ar was 150 sccm, and the heat treatment time was 2 hours.

EXAMPLE 16

Fabrication of Single Crystalline $Ni_3Co$ Nanoplate

Fabrication of a single crystalline $Ni_3Co$ nanoplate, which is a Ni—Co binary alloy, was performed using the same apparatus and condition as those of Example 1, except that 0.5 g of Ni (Sigma-Aldrich, 266965-50G), 0.5 g of $NiCl_2$ (Sigma-Aldrich, 451195-5G) and 0.5 g of $CoCl_2$ (Sigma-Aldrich, 409332-1G) were used as the precursor, a single crystalline sapphire substrate of c-plane was used as the single crystalline substrate, the temperature of the front portion of the reactor was 800° C., the temperature of the rear portion of the reactor was 900° C., the pressure in the tube was 760 torr, the flow rate of the Ar was 150 sccm, and the heat treatment time was 2 hours.

Analysis for the single crystalline metal nanoplates fabricated through Example 1 through Example 16 was performed so as to analyze quality and morphology of the single crystalline metal nanoplate fabricated in accordance with the present invention.

Figure 2:
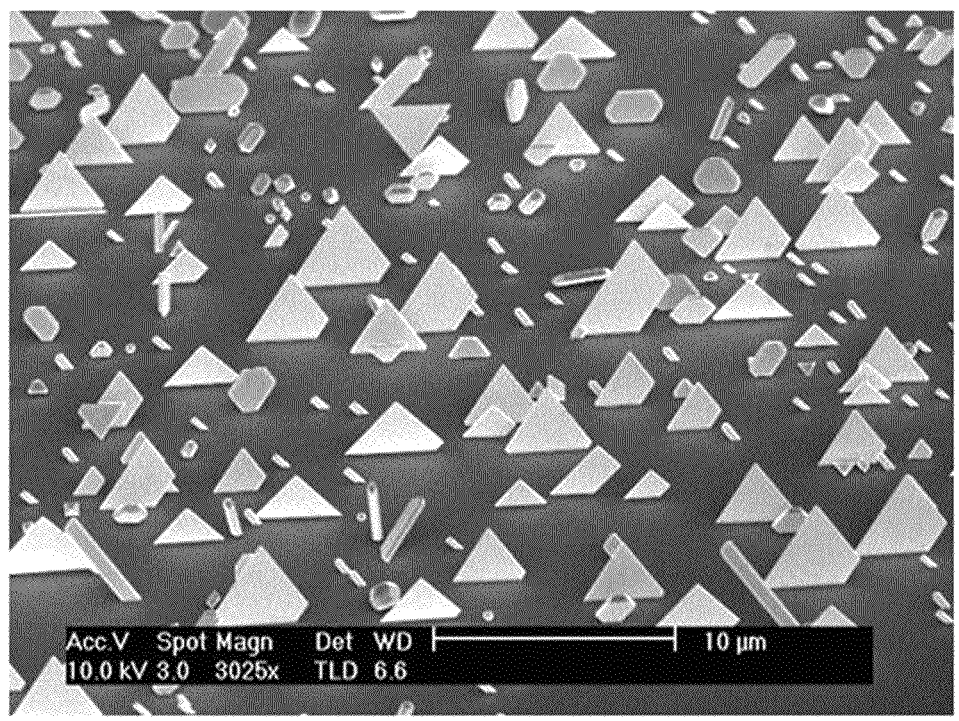
FIG. 2 is a SEM photograph of an Au nanoplate fabricated through Example 2.

FIG. 1 is a photograph by a scanning electron microscope (SEM) of an Au nanoplate fabricated through Example 1 (observation was made with the single crystalline substrate being tilted by 45 degrees) and FIG. 2 is a SEM photograph of an Au nanoplate fabricated through Example 2 (observation was made with the single crystalline substrate being tilted by 45 degrees).

It can be appreciated from FIGS. 1 and 2 that an Au nanoplate having a side length of several to tens µm was fabricated and a nanoplate of a polygonal plate shape was fabricated. It can be appreciated that a nanoplate of a triangular shape or a trapezoidal shape which is formed by cutting one apex of a triangle is generally fabricated.

It can be also appreciated from the SEM photographs in FIGS. 1 and 2 that the fabricated Au nanoplate is epitaxially grown to have a specific orientation with respect to the surface of the single crystalline substrate, and the Au nanoplates are inclined with respect to the surface of the single crystalline substrate and thus a direction vertical to the face (the largest face) of the Au nanoplate has both the component parallel to the surface of the single crystalline substrate and the component vertical to the surface of the single crystalline substrate. At this time, it can be appreciated that a large amount of the Au nanoplates are formed on the single crystalline substrate and the Au nanoplates are parallel to each other.

From the results of FIGS. 1 and 2, it can be appreciated that the orientation of the Au nanoplate varies with the material and surface direction of the single crystalline substrate.

Figure 3:
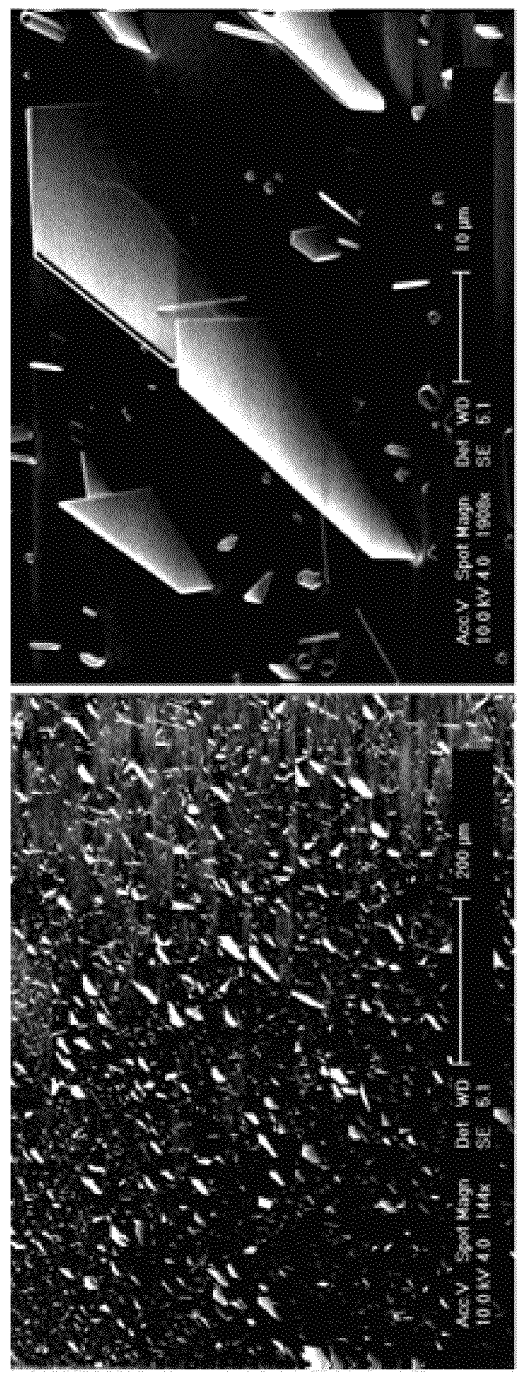
FIG. 3 is a SEM photograph of an Ag nanoplate fabricated through Example 3.
Figure 4:
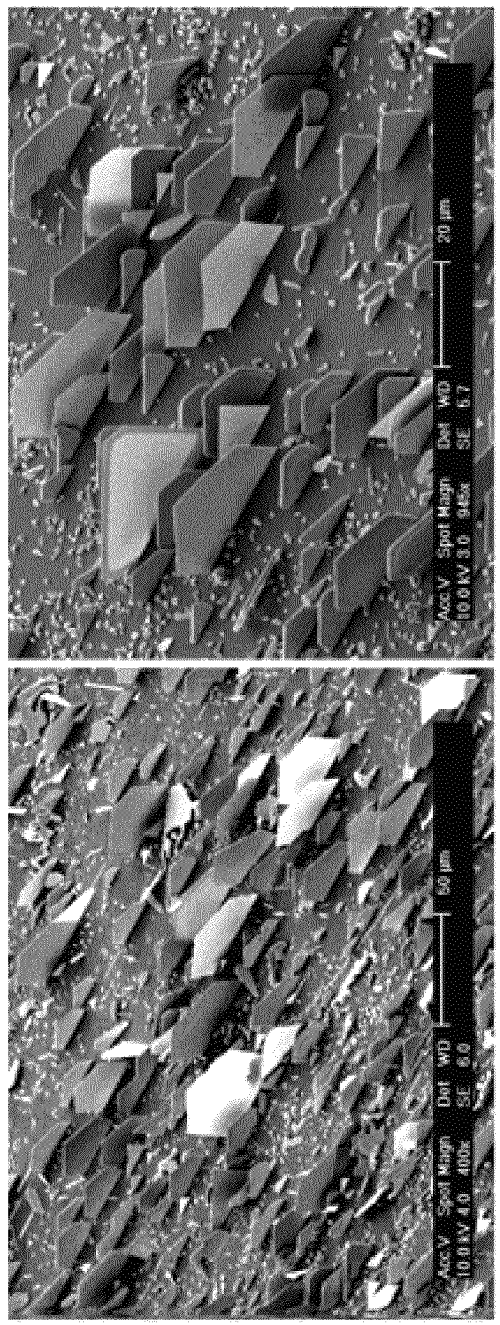
FIG. 4 is a SEM photograph of an Ag nanoplate fabricated through Example 4.
Figure 5:
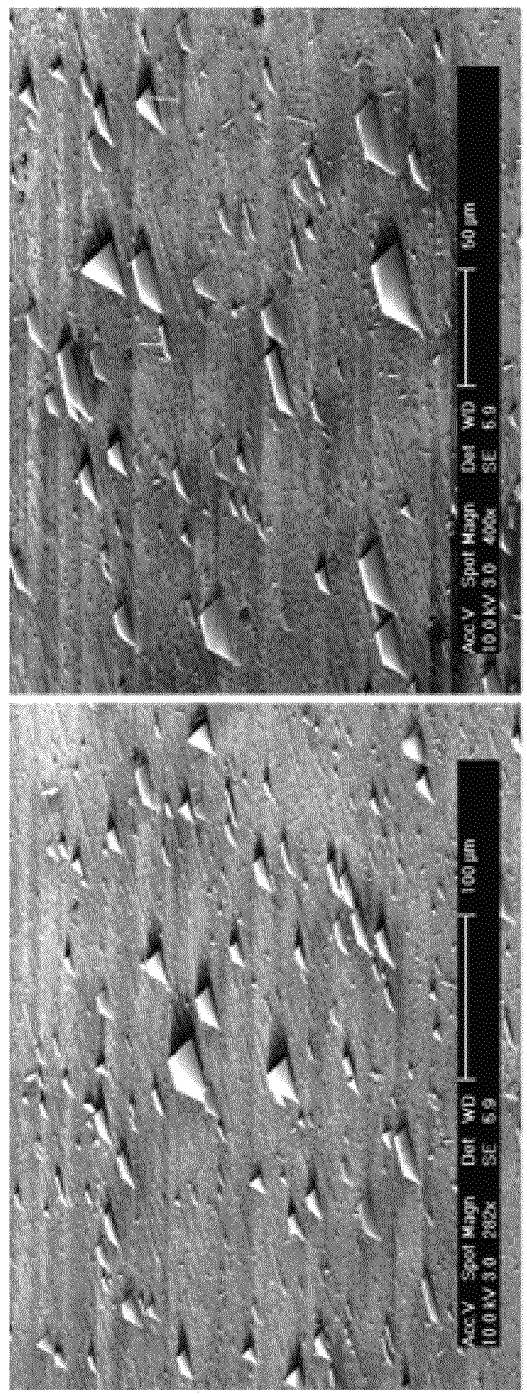
FIG. 5 is a SEM photograph of an Ag nanoplate fabricated through Example 5.

FIG. 3 is a SEM photograph of an Ag nanoplate fabricated through Example 3 (observation was made with the single crystalline substrate being tilted by 45 degrees), FIG. 4 is a SEM photograph of an Ag nanoplate fabricated through Example 4 (observation was made with the single crystalline substrate being tilted by 45 degrees), and FIG. 5 is a SEM photograph of an Ag nanoplate fabricated through Example 5 (observation was made with the single crystalline substrate being tilted by 45 degrees).

From FIGS. 3 to 5, it can be appreciated that a very large Ag nanoplate having a side length of 10 µm or more was fabricated and a polygonal plate shaped nanoplate having an epitaxial relation with respect to the substrate is fabricated like the Au nanoplate. It can be appreciated that a pentagonal nanoplate was generally fabricated and triangular, parallelogrammic and trapezoidal nanoplates were also fabricate.

In the SEM photographs in FIGS. 3 to 5, the observation was made with the substrate being tilted and the Ag nanoplates grown vertically to the substrate surface were fabricated in all of Examples 3 to 5.

Also, it can be appreciated that the nanoplates have a relation that they are parallel to each other regardless of the morphology of the fabricated Ag nanoplate, and the density, size and morphology of the fabricated Ag nanoplate vary as the surface direction of the single crystalline substrate varies. It can be appreciated that pentagonal Ag nanoplates are generally fabricated on the a-plane and r-plane but trapezoidal Ag nanoplates are generally fabricated on the m-plane.

Figure 6:
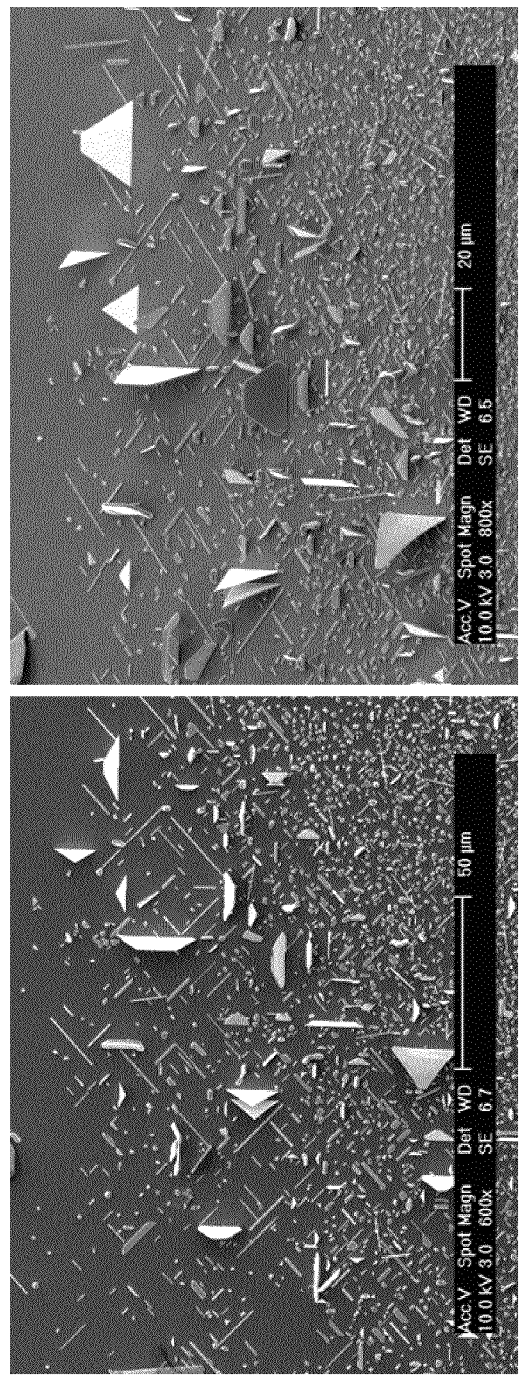
FIG. 6 is a SEM photograph of an Ag nanoplate fabricated through Example 6.
Figure 7:
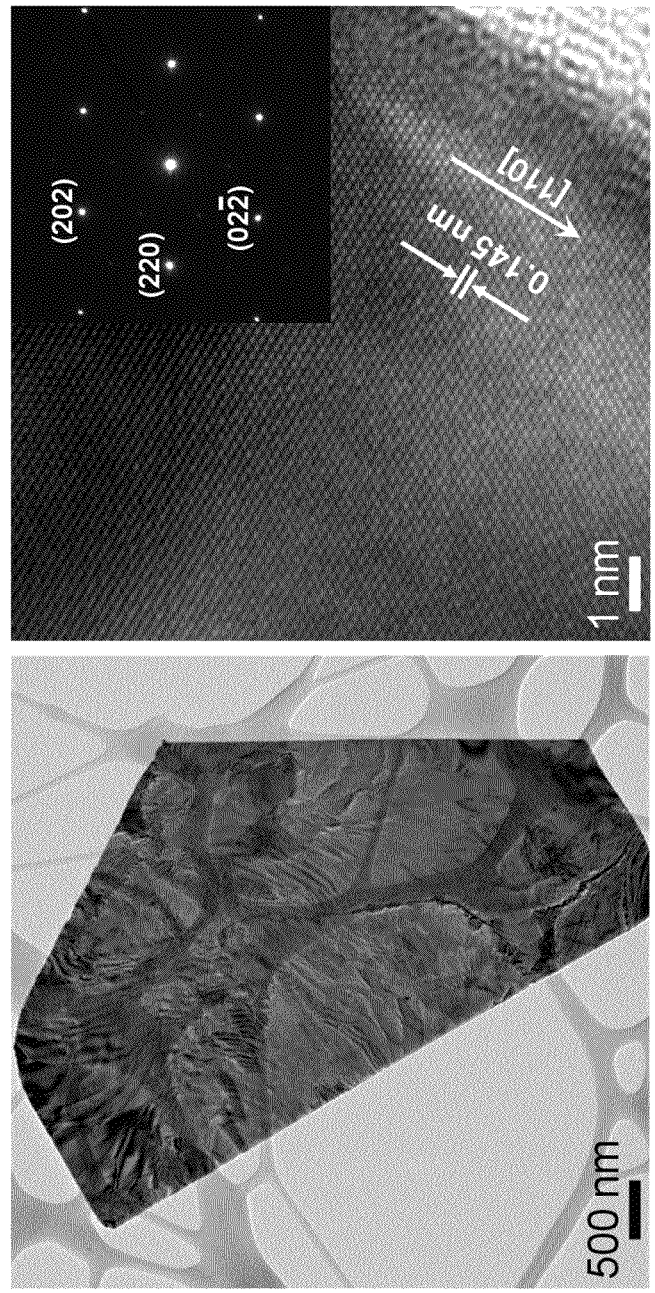
FIG. 7 is a photograph by a transmission electron microscope (TEM) and a photograph by a high resolution TEM (HRTEM) of a fabricated Ag nanoplate.

FIG. 6 is a SEM photograph of an Ag nanoplate fabricated through Example 6 (observation was made with the single crystalline substrate being tilted by 45 degrees), and FIG. 7 is a photograph by a transmission electron microscope (TEM) and a photograph by a high resolution TEM (HRTEM) of a fabricated Ag nanoplate, in which the upper right portion of the HRTEM photograph is a selected area electron diffraction (SAED) pattern of the Ag nanoplate.

It can be appreciated that the density, size and morphology vary as the single crystalline substrate varies as shown in FIG. 6, it can be appreciated from the observation result of FIG. 7 that one Ag nanoplate is made of a single crystal body, and it can be appreciated from the result of pattern indexing that an Ag nanoplate having a FCC structure, which is the same as bulk Ag, was fabricated and a plane of the nanoplate is {111} and a side of the nanoplate plane is a <110> direction.

Figure 8:
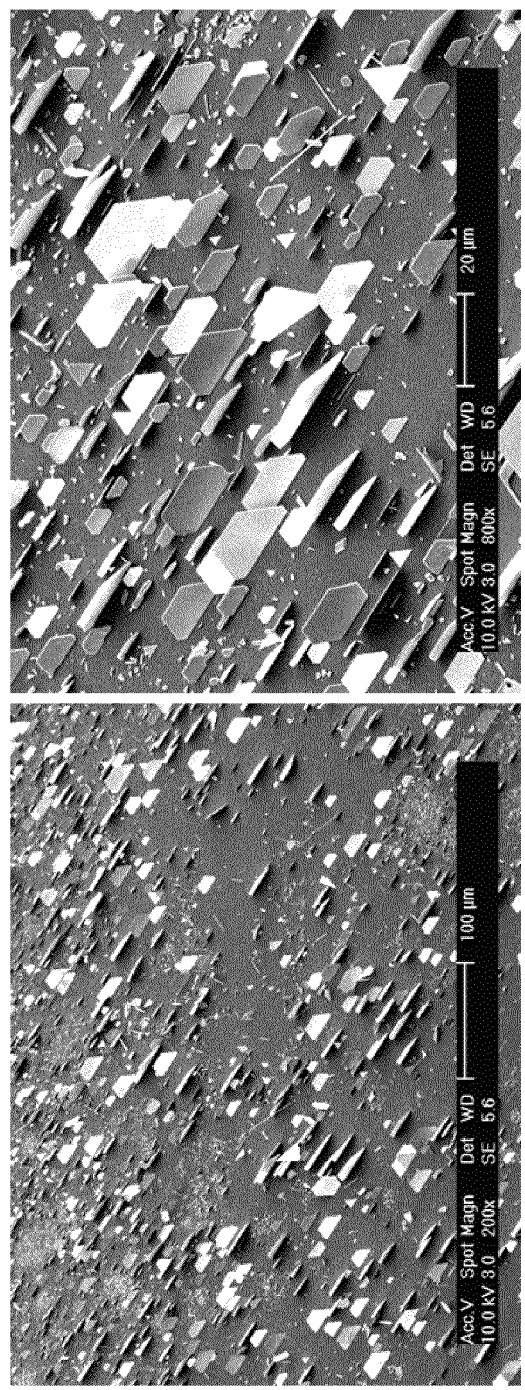
FIG. 8 is a SEM photograph of a Pd nanoplate fabricated through Example 7.
Figure 9:
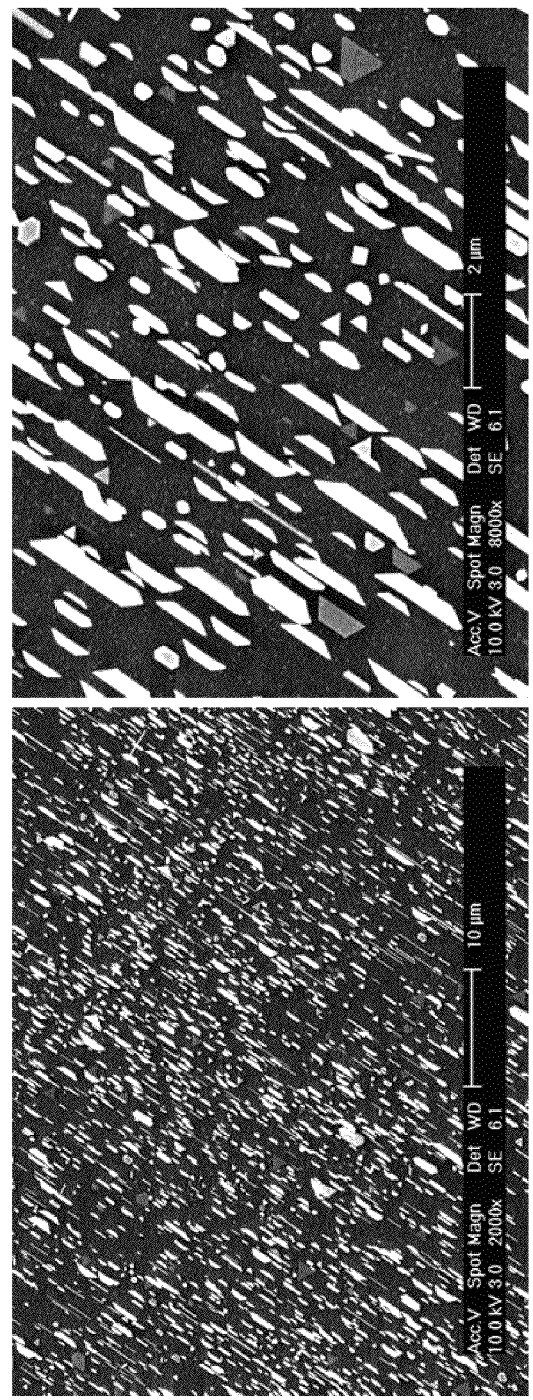
FIG. 9 is a SEM photograph of a Pd nanoplate fabricated through Example 8.
Figure 10:
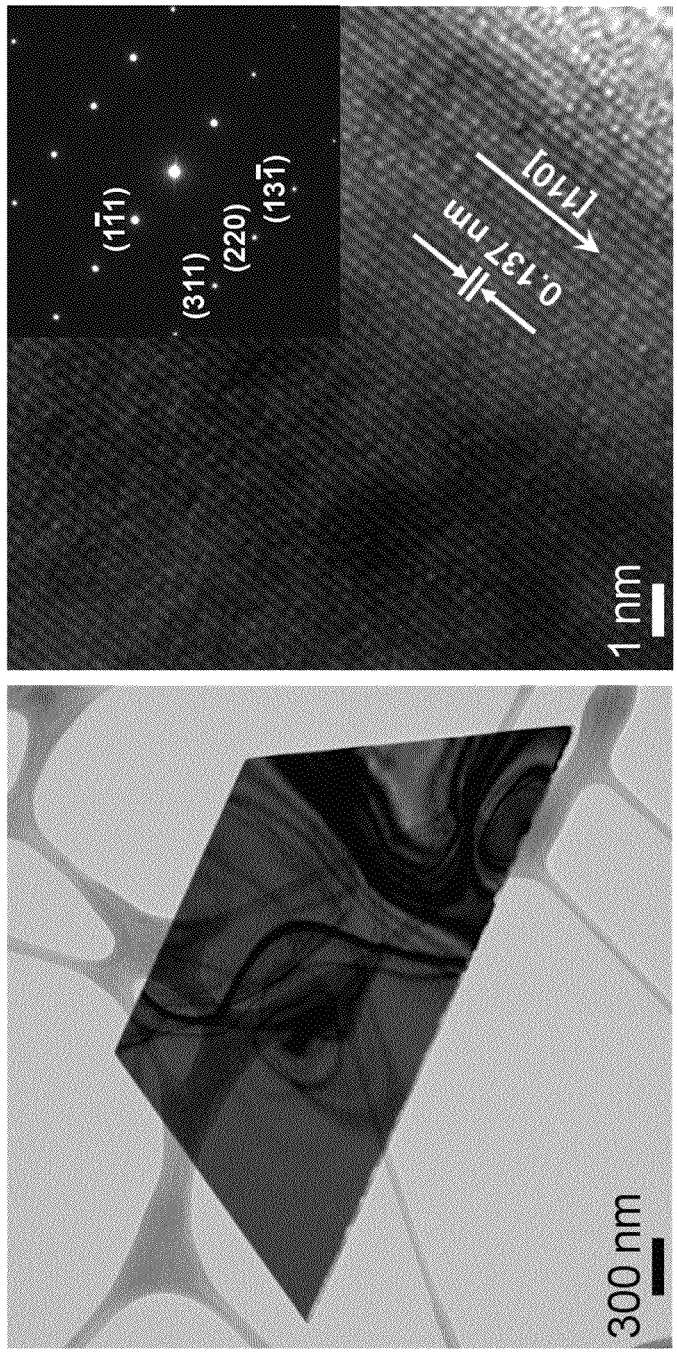
FIG. 10 is a TEM photograph and a HRTEM photograph of a fabricated Pd nanoplate.

FIG. 8 is a SEM photograph of a Pd nanoplate fabricated through Example 7 (observation was made with the single crystalline substrate being tilted by 45 degrees), FIG. 9 is a SEM photograph of a Pd nanoplate fabricated through Example 8 (observation was made with the single crystalline substrate being tilted by 45 degrees), and FIG. 10 is a TEM photograph and a HRTEM photograph of a fabricated Pd nanoplate, in which the upper right portion of the HRTEM photograph is a selected area electron diffraction (SAED) pattern of the Pd nanoplate.

From the results of FIGS. 8 to 10, it can be appreciated that a faceted Au nanoplate of a polygonal plate shape having a size of several to tens μm is fabricated and the fabricated Au nanoplates are parallel to each other and have a specific orientation with respect to the substrate by the substrate, and one Pd nanoplate is made of a single crystal body.

Figure 11:
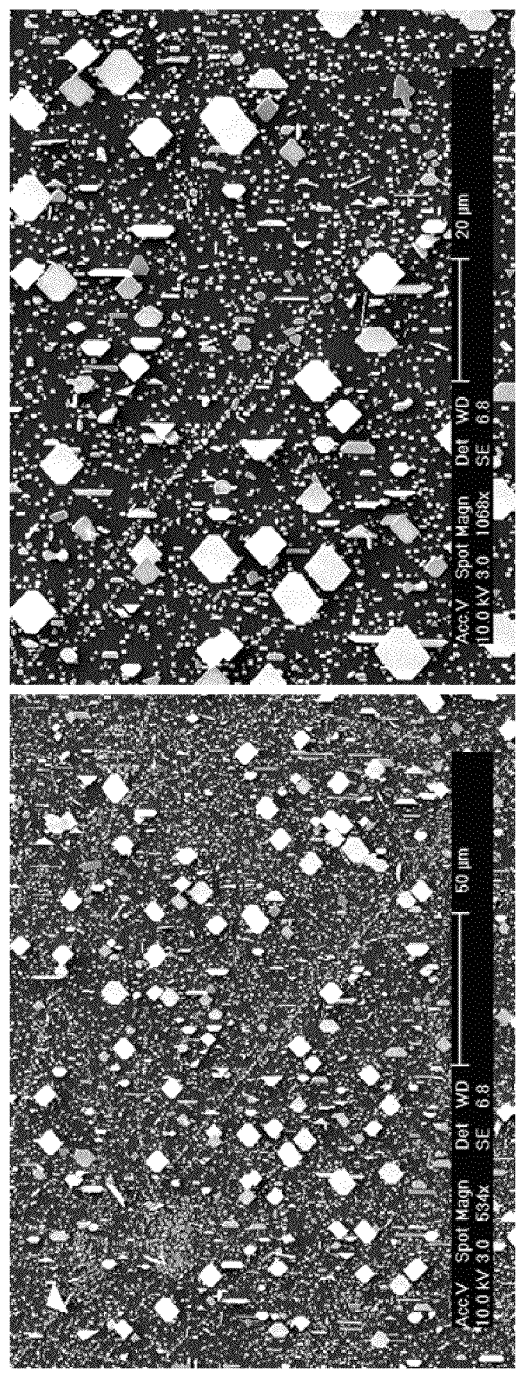
FIG. 11 is a SEM photograph of an AuPd nanoplate fabricated through Example 9.
Figure 12:
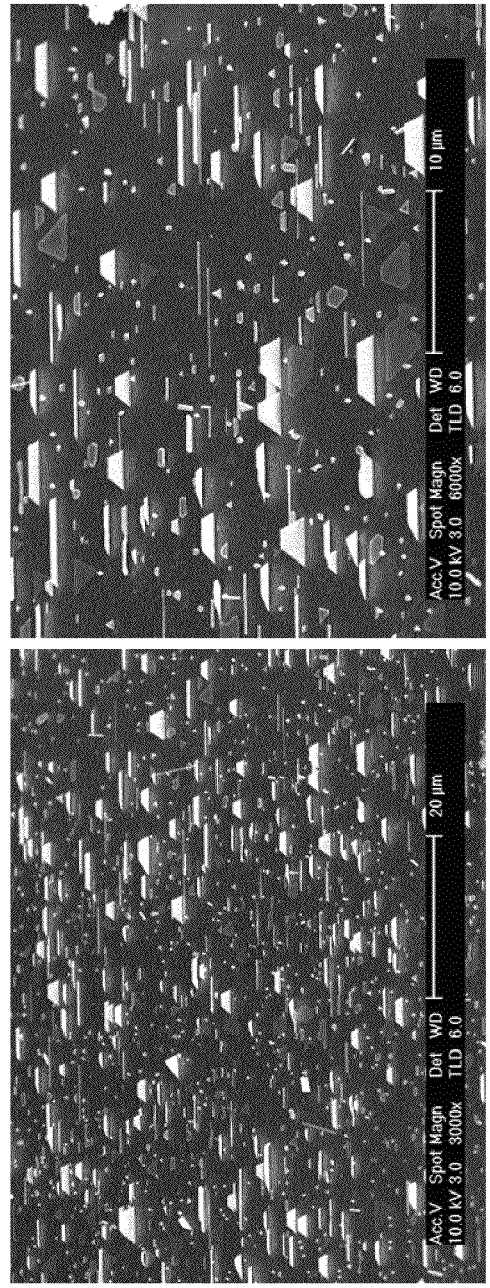
FIG. 12 is a SEM photograph of an AuPd nanoplate fabricated through Example 10.
Figure 13:
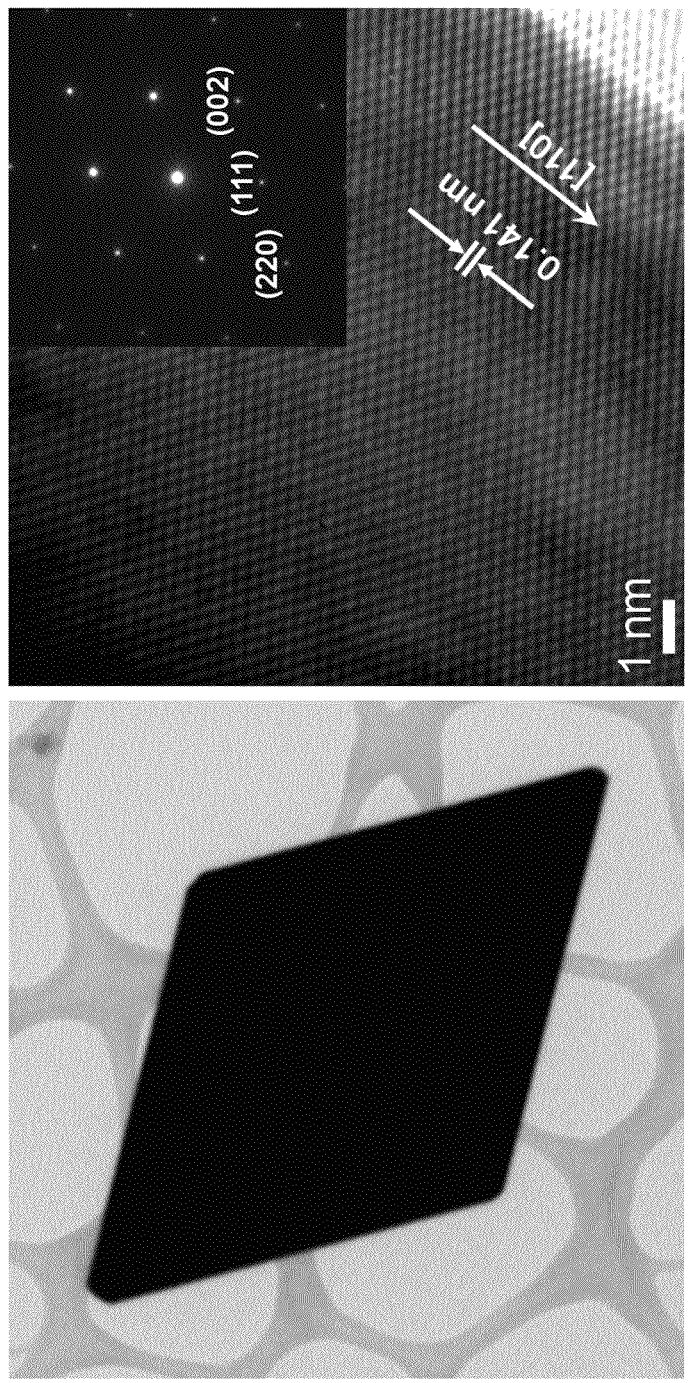
FIG. 13 is a TEM photograph and a HRTEM photograph of a fabricated AuPd nanoplate.

FIG. 11 is a SEM photograph of an AuPd nanoplate fabricated through Example 9 (observation was made with the single crystalline substrate being tilted by 45 degrees), FIG. 12 is a SEM photograph of an AuPd nanoplate fabricated through Example 10 (observation was made with the single crystalline substrate being tilted by 45 degrees), and FIG. 13 is a TEM photograph and a HRTEM photograph of a fabricated AuPd nanoplate, in which the upper right portion of the HRTEM photograph is a SAED pattern of the AuPd nanoplate.

Figure 14:
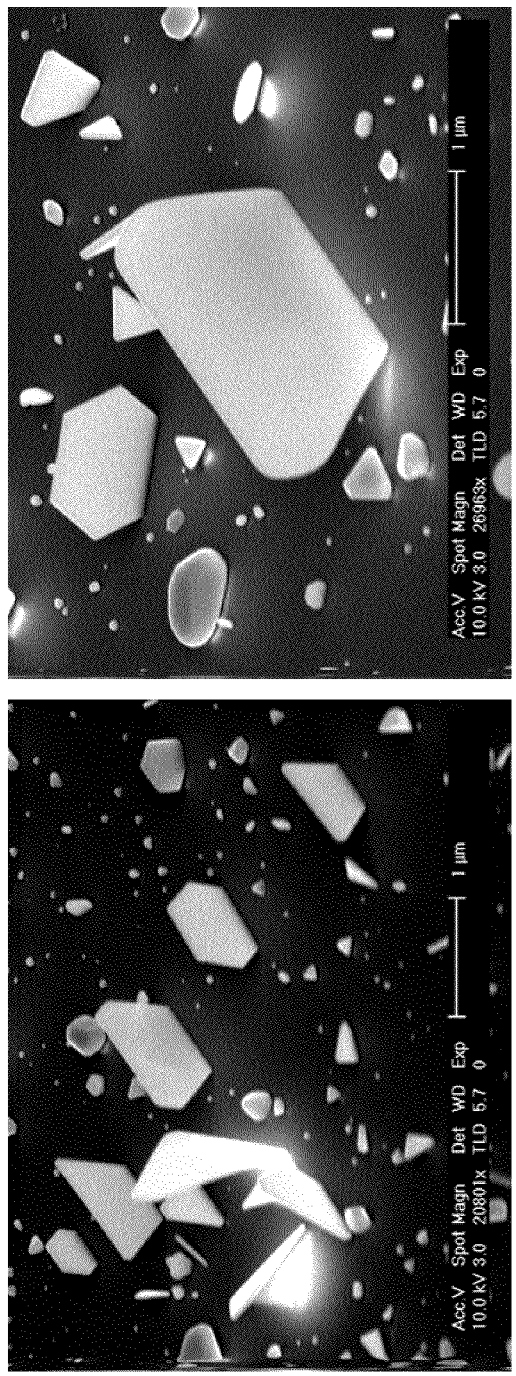
FIG. 14 is a SEM photograph of a Pt nanoplate fabricated through Example 11.
Figure 15:
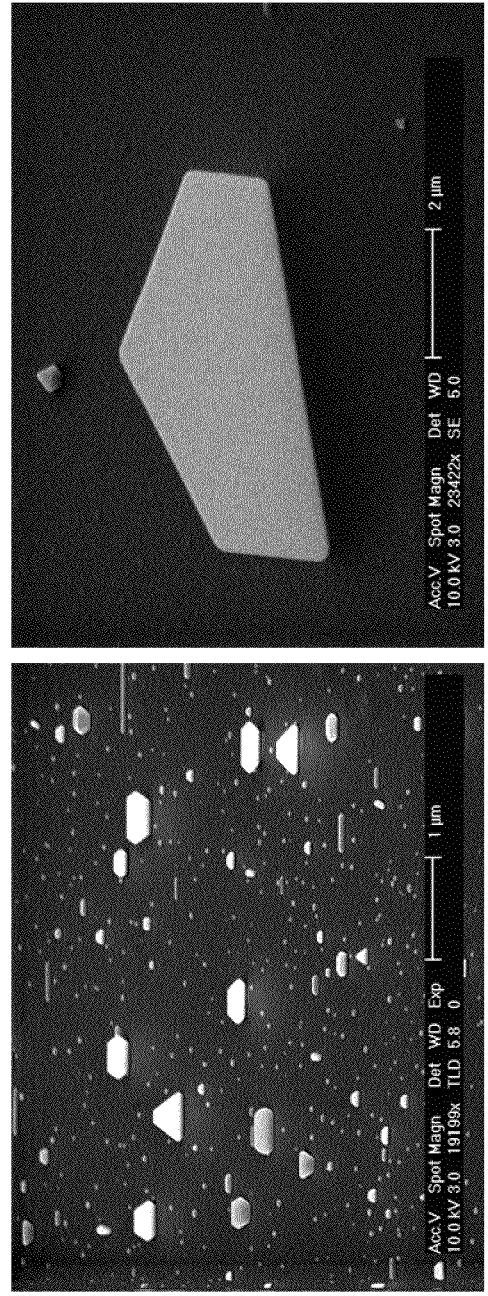
FIG. 15 is a SEM photograph of a Pt nanoplate fabricated through Example 12.
Figure 16:
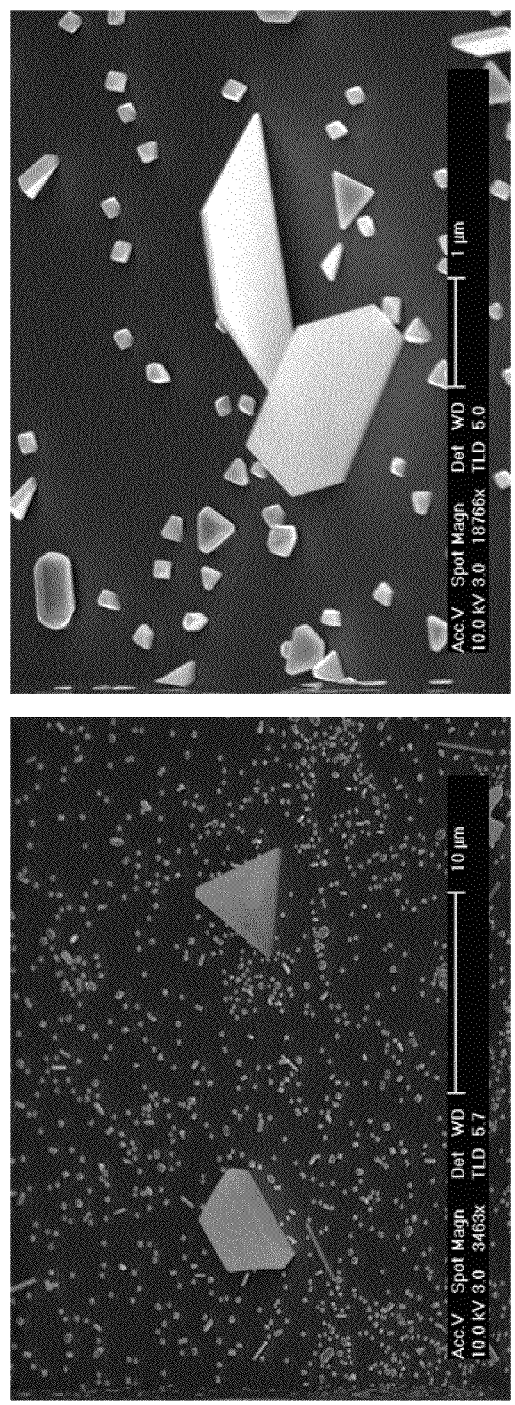
FIG. 16 is a SEM photograph of a Pt nanoplate fabricated through Example 13.
Figure 17:
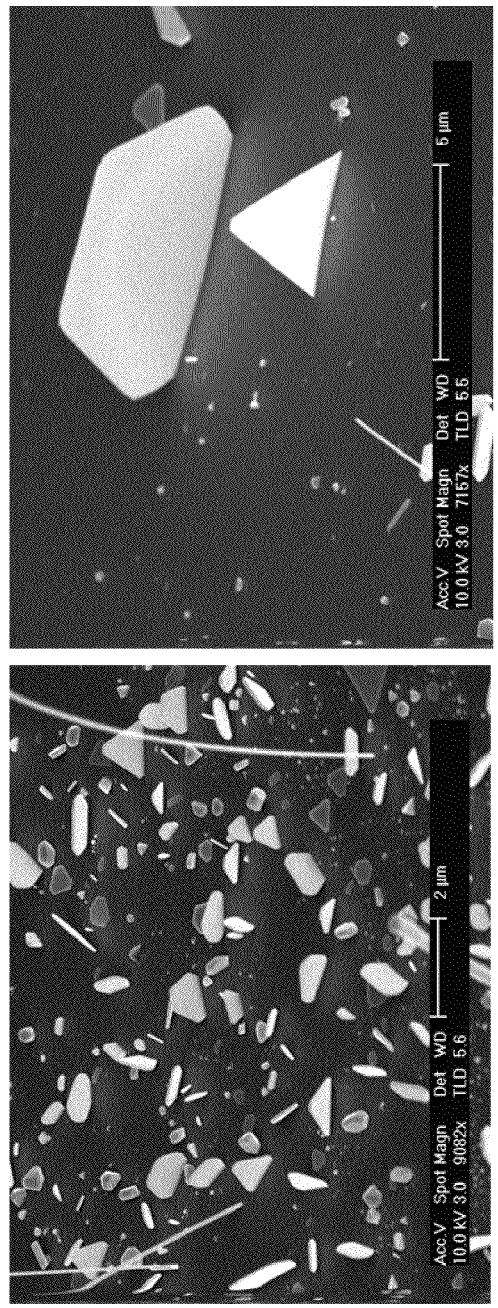
FIG. 17 is a SEM photograph of a Pt nanoplate fabricated through Example 14.
Figure 18:
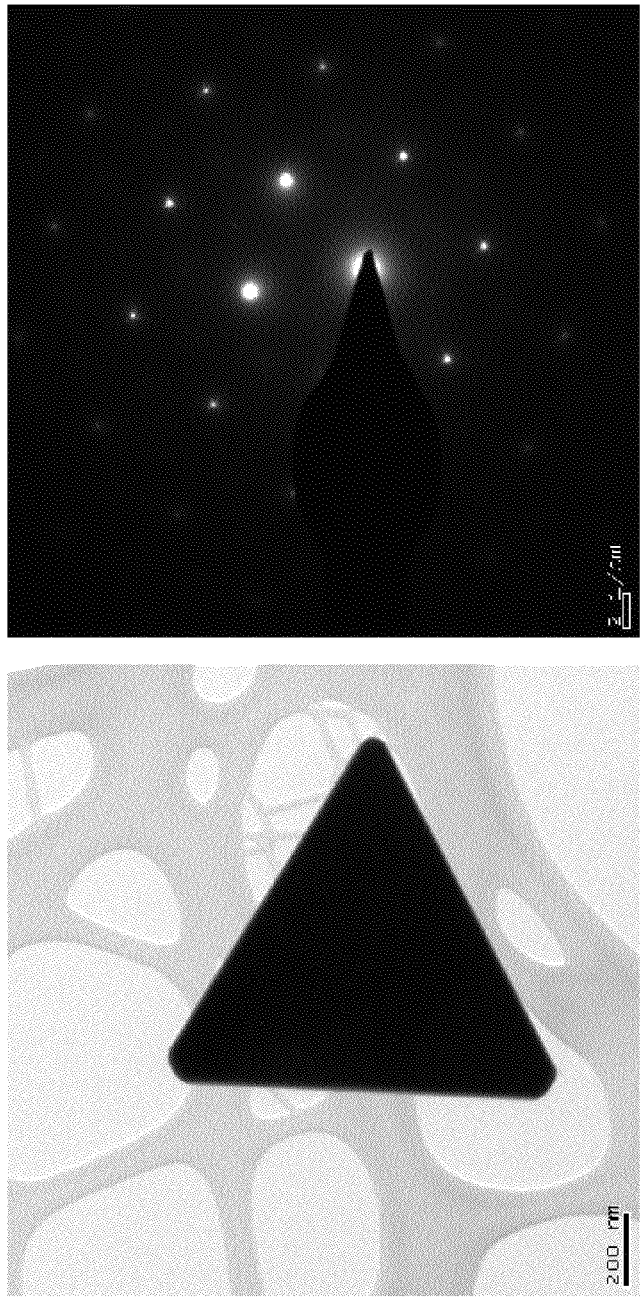
FIG. 18 is a TEM photograph and a HRTEM photograph of a fabricated Pt nanoplate.

FIG. 14 is a SEM photograph of a Pt nanoplate fabricated through Example 11 (observation was made with the single crystalline substrate being tilted by 45 degrees), FIG. 15 is a SEM photograph of a Pt nanoplate fabricated through Example (observation was made with the single crystalline substrate being tilted by 45 degrees), FIG. 16 is a SEM photograph of a Pt nanoplate fabricated through Example 13 (observation was made with the single crystalline substrate being tilted by 45 degrees), FIG. 17 is a SEM photograph of a Pt nanoplate fabricated through Example 14 (observation was made with the single crystalline substrate being tilted by 45 degrees), and FIG. 18 is a TEM photograph and a HRTEM photograph of a fabricated Pt nanoplate, in which the upper right portion of the HRTEM photograph is a SAED pattern of the Pt nanoplate.

Figure 19:
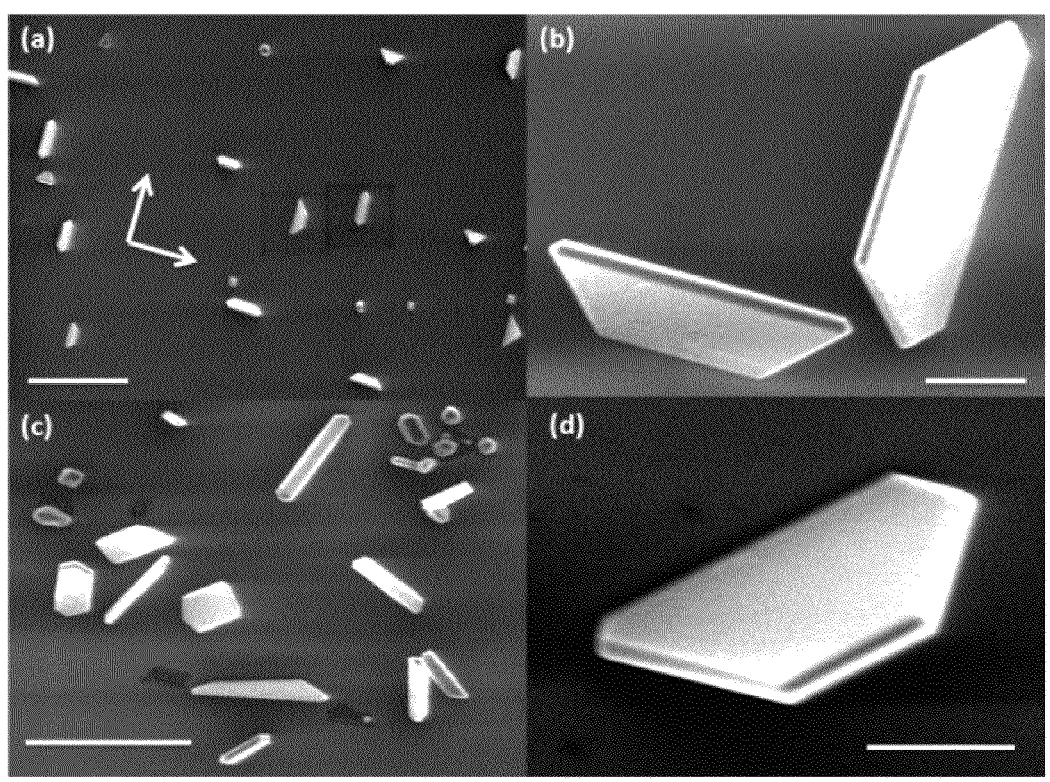
FIG. 19 is a SEM photograph of a Ni nanoplate fabricated through Example 15.
Figure 20:
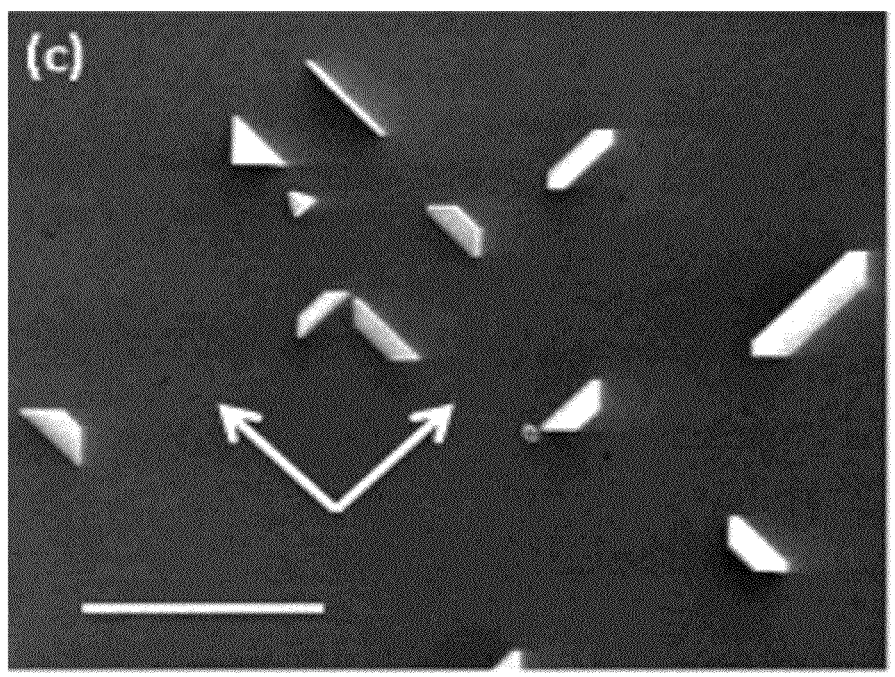
FIG. 20 is a SEM photograph of a $Ni_3Co$ nanoplate fabricated through Example 16.

FIG. 19 is a SEM photograph of a Ni nanoplate fabricated through Example 15 (observation was made with the single crystalline substrate being tilted by 45 degree) and FIG. 20 is a SEM photograph of a Ni3Co nanoplate fabricated through Example 16 (observation was made with the single crystalline substrate being tilted by 45 degree).

From the results of FIGS. 1 to 20, it can be appreciated that a faceted nanoplate of a polygonal plate shape having a side length of several to tens μm is fabricated through the fabrication method of the present invention. It can also be appreciated that a nanoplate of a polygonal shape including pentagon, triangle, parallelogram and trapezoid, the single nanoplate is made of a single crystal body including no two-dimensional defect, a large amount of nanoplates which are parallel to each other regardless of the morphology of the nanoplate is fabricated, and the orientation with respect to the substrate surface, density, size and morphology are controlled by controlling the material of the substrate, the surface direction of the substrate or the combination thereof.

The present application contains subject matter related to Korean Patent Application No. 2008-0092652, filed in the Korean Intellectual Property Office on Sep. 22, 2008, the entire contents of which is incorporated herein by reference.

While the present invention has been described with respect to the specific embodiments, it will be apparent to those skilled in the art that various changes and modifications may be made without departing from the spirit and scope of the invention as defined in the following claims.

The invention claimed is:

1. A single crystalline metal nanoplate, which is fabricated on a single crystalline substrate by performing heat treatment on a precursor including metal, metal halide or a mixture thereof and placed at a front portion of a reactor and the single crystalline substrate placed at a rear portion of the reactor under an inert gas flowing condition,
    wherein a surface direction of the single crystalline substrate is controlled so that the single crystalline metal nanoplate is fabricated as a single crystal body of a polygonal plate shape on the single crystalline substrate,
    wherein a plate plane of the single crystalline metal nanoplate is epitaxially grown vertically or at an incline with respect to a surface of the single crystalline substrate so that the single crystalline metal nanoplate has a specific orientation.

2. The single crystalline metal nanoplate of claim 1, wherein the metal nanoplate may be a noble metal nanoplate, a binary alloy nanoplate (I) made of two noble metals, a transition metal nanoplate, and a binary alloy nanoplate (II) made of two transition metals.

3. The single crystalline metal nanoplate of claim 1, wherein the single crystalline nanoplate of the polygonal plate shape is a hexagonal, pentagonal, rectangular, triangular, paralelogrammic or trapezoidal nanoplate, and has a side length of at least 1.25 μm.

4. The single crystalline metal nanoplate of claim 1, wherein the single crystalline substrate may be a sapphire of a({11-20}) surface, a sapphire of r({1-102}) surface, a sapphire of m({1-100}) surface, a sapphire of c({0001}) surface, lanthanum aluminum oxide (LAO) of {001} surface, strontium titanate (STO) of {100} surface, or titanium dioxide of {110} surface.

5. The single crystalline metal nanoplate of claim 1, wherein the single crystalline metal nanoplate has a face centered cubic (FCC) structure, and the plate plane of the single crystalline metal nanoplate is {111} plane and a direction of a side of the nanoplate includes <110> direction.

6. The single crystalline metal nanoplate of claim 1, wherein the single crystalline metal nanoplate is configured such that the plurality of single crystalline metal nanoplates are fabricated on the single crystalline substrate so that the plate planes are substantially parallel to each other.

7. The single crystalline metal nanoplate of claim 1, wherein the precursor is selected from the group consisting of Au, Pd, a mixture of Au and Pd, Ag, Pt halide, a mixture of Ni and Ni halide, and a mixture of Ni, Ni halide and Co halide.

* * * * *